United States Patent [19]
Rust

[11] Patent Number: 5,969,578
[45] Date of Patent: Oct. 19, 1999

[54] WAVEGUIDE OSCILLATOR HAVING PLANAR SLOTTED GUIDE STRUCTURE

[75] Inventor: Stefan Rust, Senden, Germany

[73] Assignee: Daimler-Benz Aerospace AG, Munich, Germany

[21] Appl. No.: 09/043,812

[22] PCT Filed: Sep. 12, 1996

[86] PCT No.: PCT/EP96/04004

§ 371 Date: Mar. 27, 1998

§ 102(e) Date: Mar. 27, 1998

[87] PCT Pub. No.: WO97/12439

PCT Pub. Date: Apr. 3, 1997

[30] Foreign Application Priority Data

Sep. 28, 1995 [DE] Germany .......................... 195 36 132

[51] Int. Cl.⁶ .................................................. H03B 9/14
[52] U.S. Cl. ................. 331/96; 331/107 DP; 331/107 G
[58] Field of Search ............................. 331/96, 107 DP, 331/107 SL, 107 G, 117 D

[56] References Cited

U.S. PATENT DOCUMENTS

| 4,222,014 | 9/1980 | Ondria | 331/107 G |
| 4,890,074 | 12/1989 | Ondria | 331/107 SL |
| 4,951,006 | 8/1990 | Cohen | 331/107 G |

FOREIGN PATENT DOCUMENTS

| 0186295 | 7/1986 | European Pat. Off. . |
| 3808251 | 9/1989 | Germany . |

*Primary Examiner*—Siegfried H. Grimm
*Attorney, Agent, or Firm*—Venable; George H. Spencer; Catherine M. Voorhees

[57] ABSTRACT

A waveguide oscillator by means of which carrier waves can be generated in a waveguide. The waveguide oscillator takes the form of a planar slotted guide structure arranged in the waveguide approximately perpendicularly to the longitudinal axis of the waveguide and has two transmitting slotted guides, at least one semiconductor oscillator element and at least one compensation slotted guide.

18 Claims, 6 Drawing Sheets

WAVEGUIDE OSCILLATOR HAVING PLANAR SLOTTED GUIDE STRUCTURE

BACKGROUND OF THE INVENTION

The invention relates to a waveguide oscillator for generating carrier waves in a waveguide having at least one semiconductor oscillating element and at least one transmitting antenna element.

Known waveguide oscillators for generating carrier waves in waveguides comprise a pole inserted into the waveguide, which functions as a transmitting/antenna element, and a semiconductor oscillating element that is inserted into the waveguide. The semiconductor oscillating element is arranged on the base for the waveguide inside area, and the pole is inserted between the housing surface of the semiconductor oscillating element and the opposite arranged waveguide surface, so that it can radiate freely into the waveguide inside area while in a perpendicular position. The semiconductor oscillating elements used in known waveguide oscillators are cased Gunn diodes, impatt diodes or similar, cased semiconductor elements, which can generate a HF oscillation when direct voltage is applied. With the known waveguide oscillators, the oscillator is adapted to the characteristic wave impedance of the waveguide by means of a quarter-wave short circuit. This short circuit consists of a waveguide segment that is closed off on one side and has a length of one fourth the wavelength of the carrier wave to be radiated. The pole with the semiconductor oscillating element is arranged at its open end. As a result of the production and assembly of the precision-mechanical parts, the known waveguide oscillators are relatively expensive. The semiconductor oscillating elements in the known waveguide oscillators can be used only as cased elements since they are affected by the contact pressure exerted by the pole. However, cased diodes are also very expensive when compared to non-cased chip diodes.

SUMMARY OF THE INVENTION

It is the object of the invention to create an economical waveguide oscillator, which makes it possible to generate carrier waves in a waveguide.

This object is solved according to the invention by a carrier wave oscillator designed as a planar slotted guide structure and arranged approximately perpendicular to the waveguide longitudinal axis in a cross-sectional surface of the elongated waveguide. The slotted guide structure has transmitting slotted guides that are connected in series with their open ends and a semiconductor oscillating element integrated into the slotted guide structure which bridges the interconnected open ends of the transmitting slotted guides where the transmitting slotted guides have the same resonance frequency. The slotted guide structure comprises at least one compensation slotted guide and the resonance frequency of the at least one compensation slotted guide deviates from the resonance frequency of the transmitting slotted guides. Direct voltage is supplied to the semiconductor oscillating element via an internal conductor surface and an external conductor surface which are separated galvanically in the slotted guide structure.

The invention has a frequency stability that is comparable to that of traditional waveguide oscillators, but for all that has a higher oscillator efficiency. The high-frequency output coupled out into the waveguide is therefore higher with the same direct voltage output. Low-cost chip diodes can be used since the invention permits a bond between the antenna elements and the diodes.

The oscillator according to the invention with its planar slotted guide structure is favorably suited for mass production since this structure can be produced through etching technology. The installation depth of the oscillator according to the invention can be kept favorably low since a quarter-wave short circuit for adapting the impedance is not absolutely required. If necessary, the oscillator output can be doubled for the same installation depth, in accordance with a modification of the invention that is characterized by the use of two semiconductor oscillating elements and a doubling of the antenna elements. Also, the oscillator output can be increased advantageously in accordance with another modification of the invention by using only one semiconductor oscillating element and doubling the antenna elements in that the additional antenna elements are provided with a HF short circuit in place of the semiconductor oscillating element. The modifications using twice the number of antenna elements are particularly suitable for waveguide circuits, since they comply with the symmetry characteristics of the waveguide field.

BRIEF DESCRIPTION OF THE DRAWINGS

Exemplary embodiments of the invention are explained in more detail with the aid of the drawing in which.

DETAILED DESCRIPTION OF THE INVENTION

Figure 1:
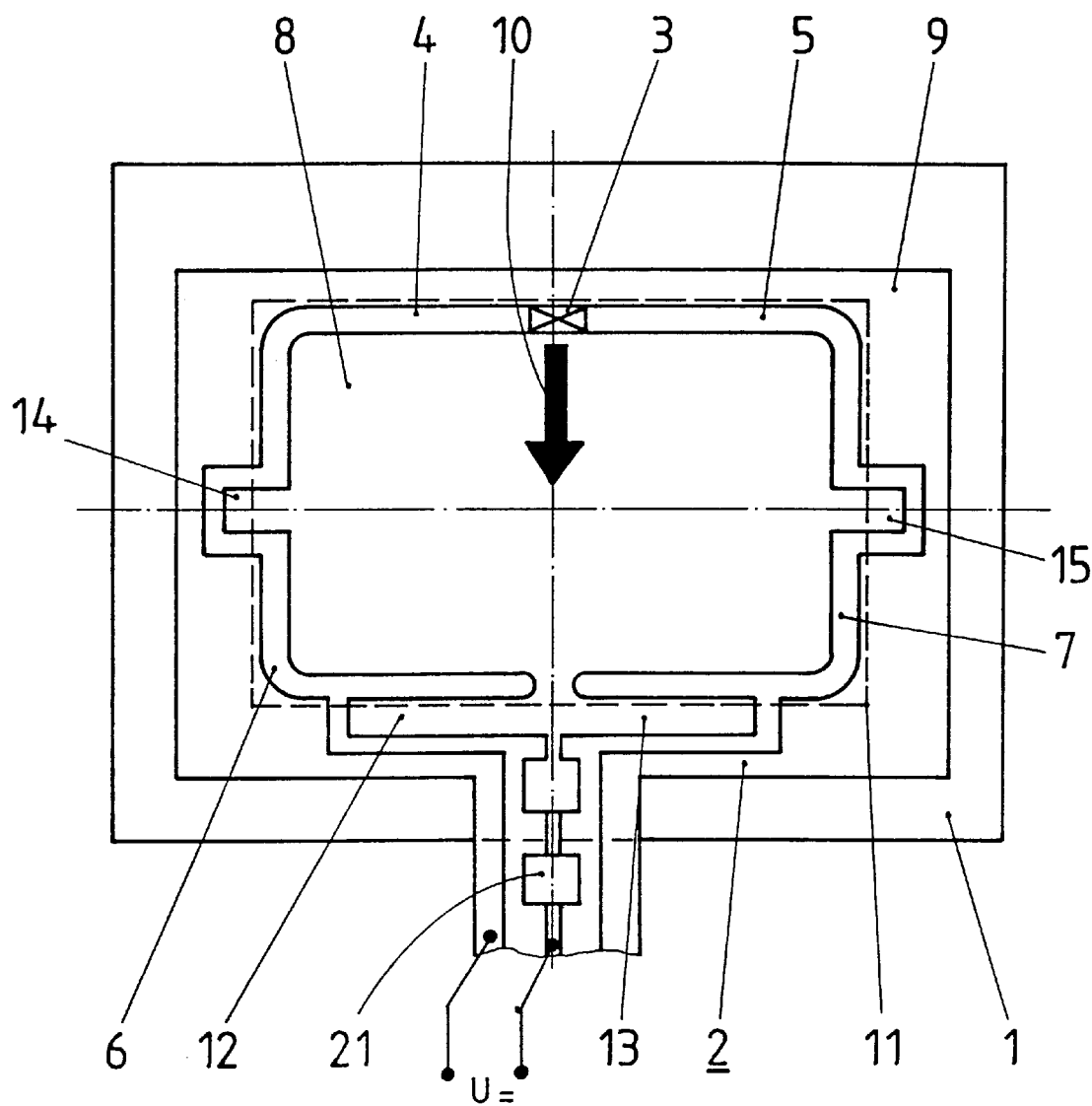
FIG. 1 shows a waveguide oscillator with a semiconductor oscillating element and slotted guides arranged around the edge.

FIG. 1 shows the slotted guide structure 2 of a waveguide oscillator for generating carrier waves in a waveguide, the structure being fitted onto the cross-sectional surface of a rectangular waveguide 1. The slotted guide structure 2 is formed in a metal layer on a planar dielectric substrate that is metallized on one side. Two transmitting slotted guides 4 and 5, two compensation slotted guides 6 and 7, a semiconductor oscillating element 3, two capacitive elements 14 and 15, two stubs 12 and 13 and a low-pass filter 21 are integrated into the slotted guide structure 2.

The transmitting slotted guides 4 and 5 are connected in series with open ends and are bridged at the junction by a non-cased semiconductor oscillating element 3. If a direct voltage is applied, the oscillating semiconductor element 3 used in this case generates HF energy and can be a Gunn diode, an impatt diode or a HF diode with a similar effect, depending on the type of use. The semiconductor oscillating element 3 is integrated into the slotted guide structure 2 by means of bonded connections. The semiconductor oscillating element 3 and the transmitting slotted guides 4 and 5 are arranged in the slotted guide structure 2 in such a way that the semiconductor oscillating element is located next to the base point of the maximum field intensity vector 10 of the adjoining waveguide-E-field.

The two transmitting slotted guides 4, 5, which are designed to be identical and thus have the same resonance frequency f (ind OI), are arranged in the slotted guide structure 2 in such a way that along their total length, their outside edge adjoins the border for the waveguide inside space 11. Their electrically effective length respectively is one half the wavelength of the carrier wave to be generated. At the ends which are not interconnected, the transmitting slotted guides 4, 5 respectively are nearly short-circuited with one 5 capacitive element 14, 15. The capacitive elements 14 and 15 are arranged outside of the border for the waveguide inside space 11.

Respectively one compensation slotted guide 6, 7 adjoins the short-circuited ends of the transmitting slotted guides 4, 5. The capacitive elements 14, 15 that short circuit the transmitting slotted guides 4, 5 also form a short circuit at the connecting points for the compensation slotted guides 6, 7. The compensation slotted guides 6, 7 also adjoin with their outside edge the border for the waveguide inside space 11, are 15 designed identically and have the same resonance frequency f (ind OII). The length for each of the compensation slotted guides 6, 7 is approximately half the wavelength of the carrier wave to be generated. However, their electrically effective length and thus the resonance frequency f (ind OII) in each case is determined by a transforming stub 12, 13, which closes off the other ends of the compensation slotted guide 6, 7. These transforming stubs 12, 13 are arranged in the slotted guide structure 2, outside of the border for the waveguide inside area 11. In accordance with FIG. 6A, 6B and 6C the resonance frequencies f (ind OII) of the compensation slotted guide 6, 7 are adjusted relative to the resonance frequencies f (ind OI) of the transmitting slotted guides 4, 5 in such a way that the reactive power generated in the region of the semiconductor oscillating element and the waveguide 1 is compensated and an optimum impedance adaptation between waveguide and oscillator is achieved.

In the slotted guide structure 2, an internal conductor surface 8 and an external conductor surface 9 are separated from each other by the slotted guides 4, 5, 6, 7. The semiconductor oscillating element 3 is supplied with direct voltage by way of these conductor surfaces. Integrated into the slotted guide structure 2 is a microstrip low-pass filter 21, which makes contact with the internal conductor surface 8 while it is galvanically separated from the external conductor surface 9.

With its external conductor surface 9, the slotted guide structure 2 is soldered into a suitable recess of the cross sectional surface for the waveguide 1. It is also possible to attach the slotted guide structure by means of adhesive technology. In a modified design, the slotted guide structure 2 can also project optionally over the outer border of waveguide 1.

Since the semiconductor oscillating element 3 feeds two slotted guides that function as resonators, and since the generated reactive power is also compensated with two slotted guides functioning as resonators, the waveguide oscillator has a very steep phase slope and thus also a good frequency is stability. The oscillating behavior of the waveguide oscillator is clear as a result of the short distance between the compensation slotted guide and the semiconductor oscillating element. FIG. 6c shows the position of the oscillator frequency f (ind OSZ), e.g. a Gunn oscillator, in the range of the highest phase slope for the oscillator circuit according to the invention. The circuit still has reactive power at this frequency, which functions to compensate the reactive power of the semiconductor oscillating element.

Figure 2:
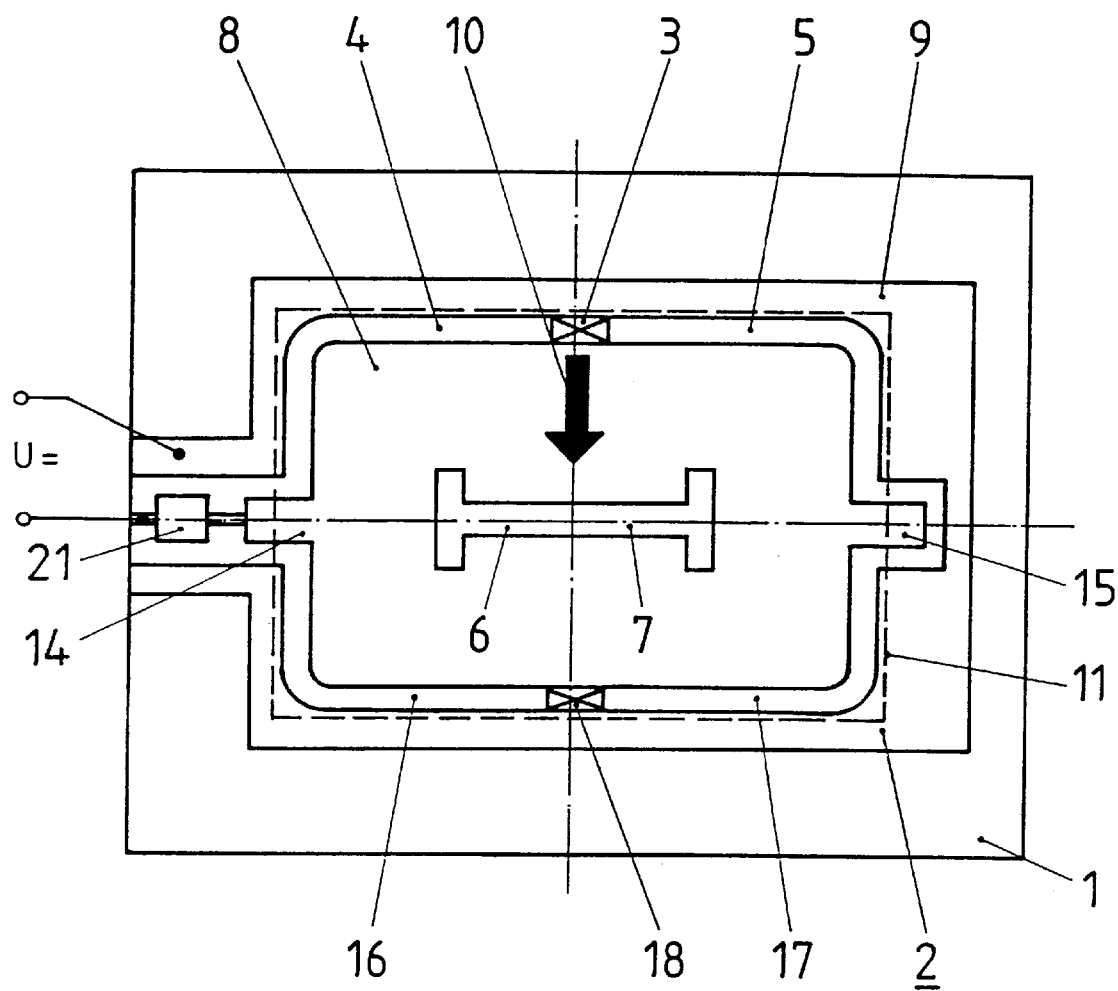
FIG. 2 shows a waveguide oscillator with two semiconductor oscillating elements where the compensation slotted guides are arranged centrally.

FIG. 2 shows a waveguide oscillator with increased oscillator output as compared to the embodiment shown in FIG. 1, which is achieved by doubling the transmitting slotted guide system and adding a second semiconductor oscillating element 18. The two semiconductor and transmitting slotted guide systems have an identical design and are arranged in a mirror symmetry in the slotted guide structure 2, so that one semiconductor oscillating element 3 is located adjacent to the base point of the maximum field strength vector 10 for the neighboring waveguide-E-field while the other semiconductor oscillating element 18 is arranged opposite the first semiconductor oscillating element 3. All slotted guides respectively have an electrically effective length of half the wavelength of the carrier wave to be generated and are arranged such that their outside edges are adjacent to the border for the waveguide inside space. The two slotted guide systems are nearly short-circuited at the ends facing away from the semiconductor oscillating elements respectively by means of a capacitive element 14, 15. These elements are identical to the elements described in FIG. 1. The semiconductor oscillating elements 3, 18 are fed with direct voltage via a low-pass filter 21, which is coupled to the side of one of the capacitive elements 14, 15 for this exemplary embodiment. Alternatively, this low-pass arrangement could also be used for the embodiment shown in FIG. 1.

The reactive powers generated by the transmitting slotted guides are compensated by means of two compensation slotted guides 6,7 with interconnected open ends. The other ends represent a short circuit and are designed such that the interconnected compensation slotted guides form an H-aperture. It is also possible to use an alternative design for the compensation slotted guides 6, 7. The H-aperture is arranged centrally in the slotted guide structure 2, in such a way that its central segment is positioned perpendicular on the maximum field strength vector 10. The resonance frequency for the compensation slotted guides 6, 7 is adjusted so as to differ from the resonance frequency for the transmitting slotted guides 4, 5, 16, 17, such that the reactive power of the transmitting slotted guides that is radiated into the waveguide is compensated in the waveguide 1.

Figure 3:
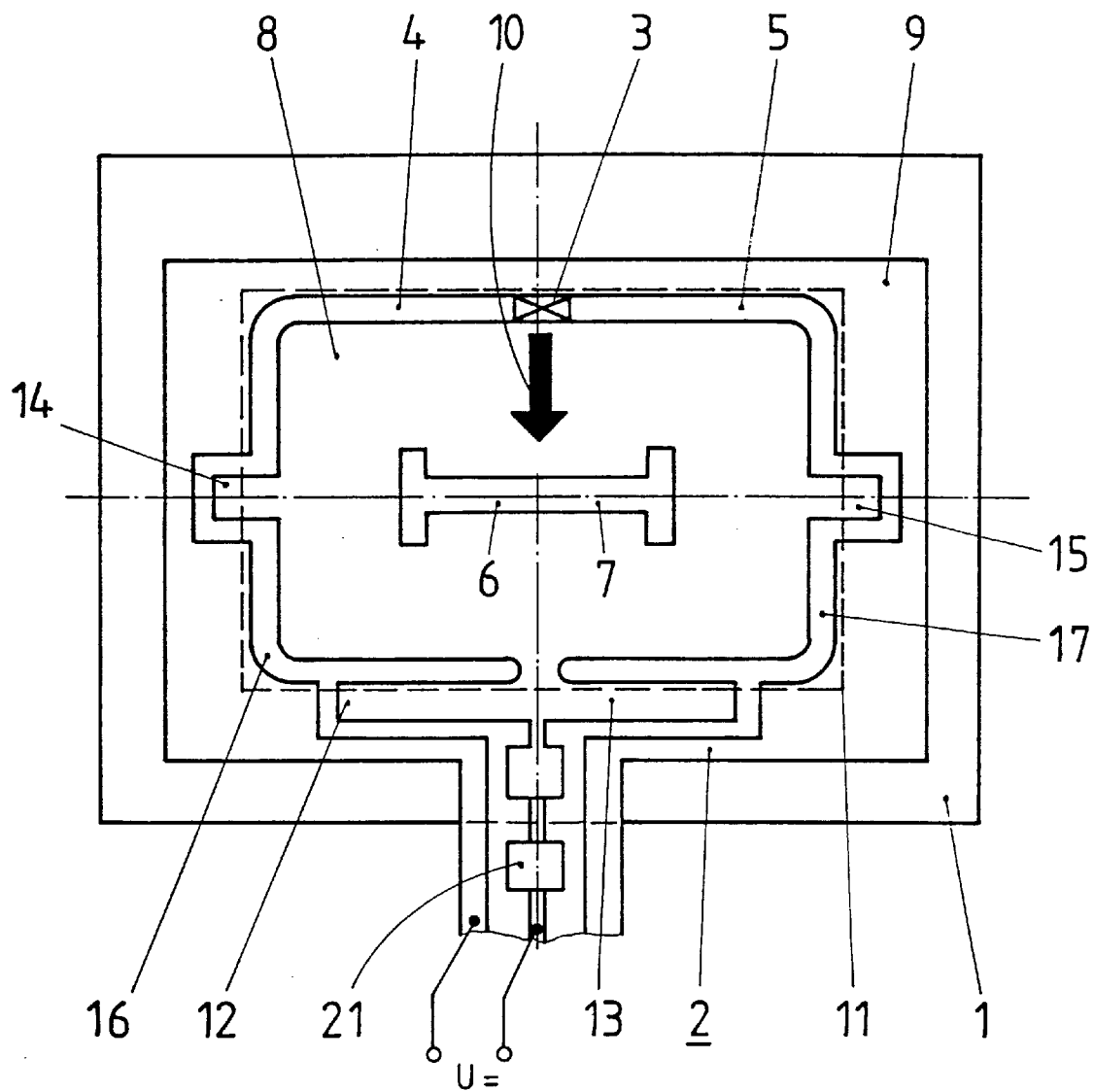
FIG. 3 shows a waveguide oscillator according to FIG. 2, where the second semiconductor oscillating element has been replaced by HF short circuits.

The basic design for the waveguide oscillator shown in FIG. 3, comprising the doubled transmitting slotted guide system and the centrally arranged H-aperture, corresponds to the exemplary embodiment shown in FIG. 2. Deviating from the embodiment shown there, the second semiconductor oscillating element 18 is omitted in this case. Instead, a transformer-generated HF short circuit is arranged between the pertinent slotted guide ends. This short circuit consists of stubs 12, 13, which have an electrically effective length of one fourth the carrier wave to be generated and are separated galvanically from the external conductor surface 9. The electrical field distributions on the transmitting slotted guides 16, 17 correspond to the field distributions for the previously described design variation with the second semiconductor oscillating element 18. The low-pass filter 21 for this design variation is coupled to the HF short circuit, but could also be coupled to one of the capacitive elements 14, 15.

Figure 4:
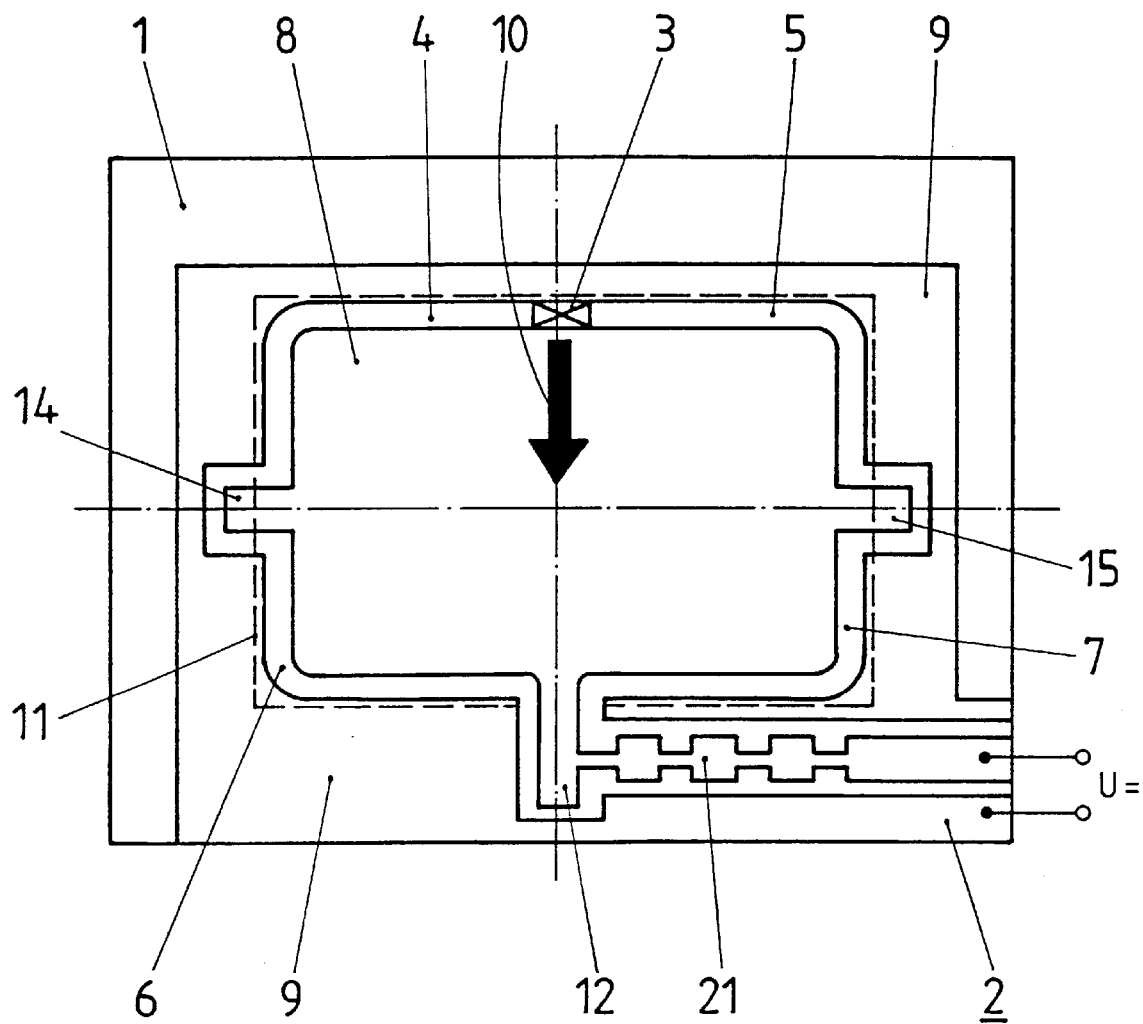
FIG. 4 illustrates a waveguide oscillator corresponding to FIG. 3, where the HF short circuits are formed with only one stub.

A simpler design version of the HF short circuit is shown in FIG. 4, wherein only one stub 12 is effective. This results in only a slight worsening of the oscillator effect as compared to the embodiment shown in FIG. 4.

Figure 5:
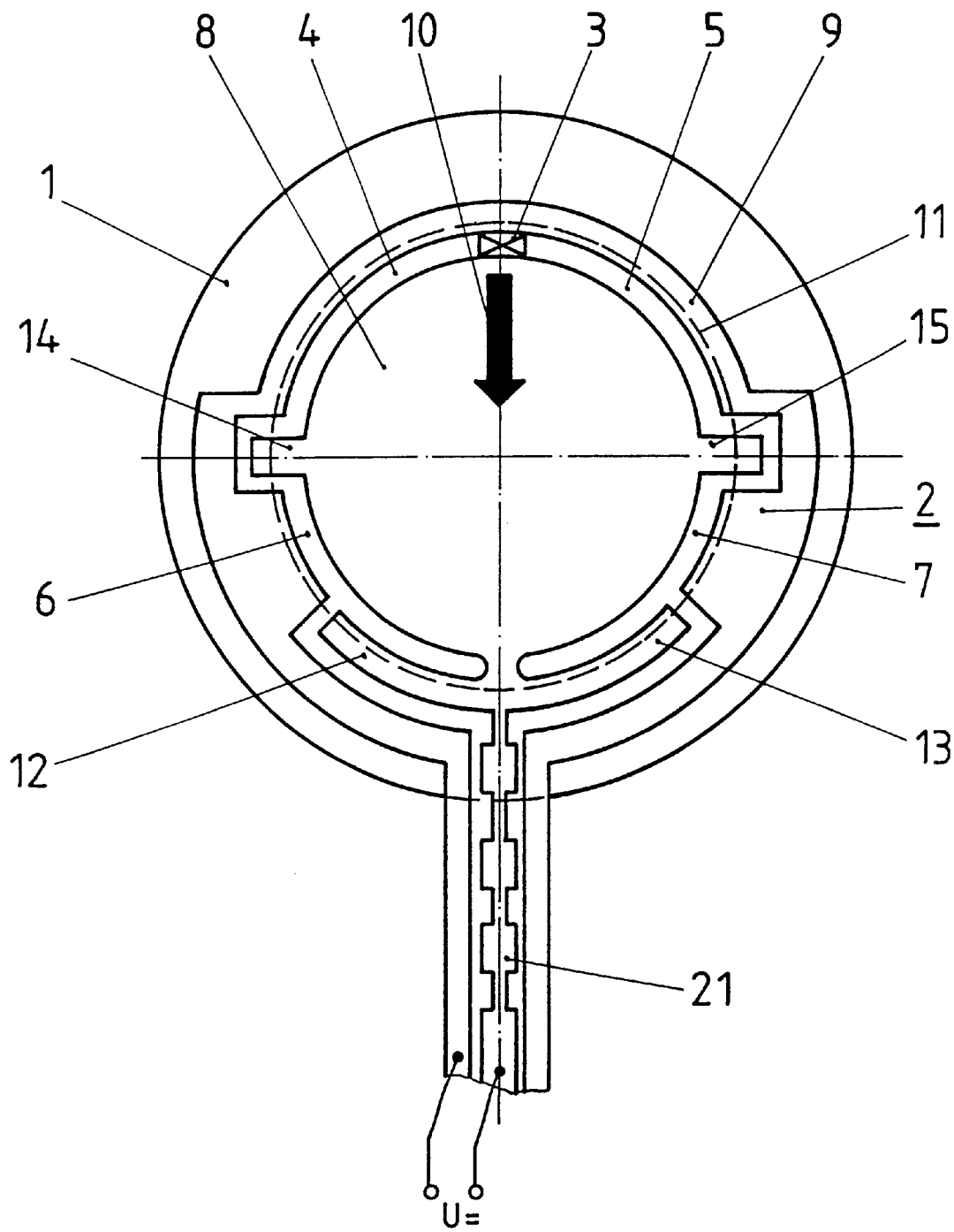
FIG. 5 shows a waveguide oscillator for a waveguide with circular cross section.

FIG. 5 shows an exemplary embodiment according to FIG. 1, which differs in that it is designed for a waveguide 1 with circular cross section. However, its basic design corresponds completely to the explanations provided in the above to FIG. 1. It is important that the semiconductor oscillating element 3 is located adjacent to the base point of the maximum field strength vector 10. In the same way as shown in FIG. 5, the exemplary embodiments shown in FIGS. 2 and 4 can also be transferred to circular waveguides.

Figure 6A:
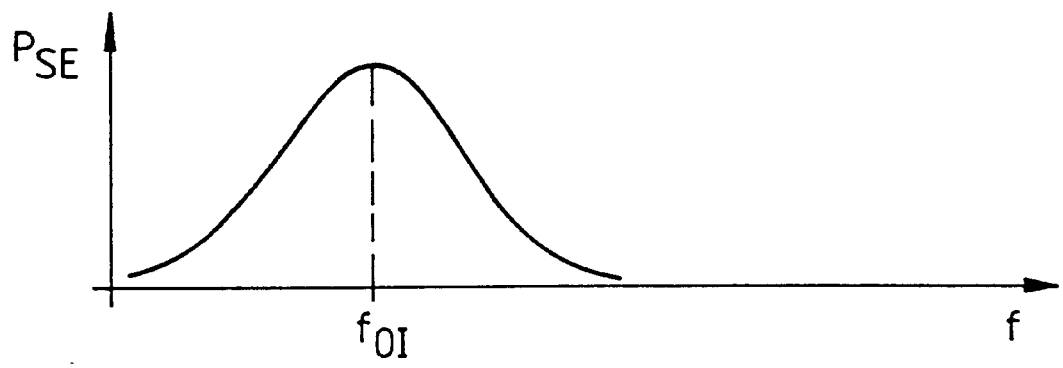
FIGS. 6A, 6B, and 6C illustrate the principle of the interaction between the resonance curves for antenna and compensation slotted guides is upon which the solutions according to the invention are based.
Figure 6B:
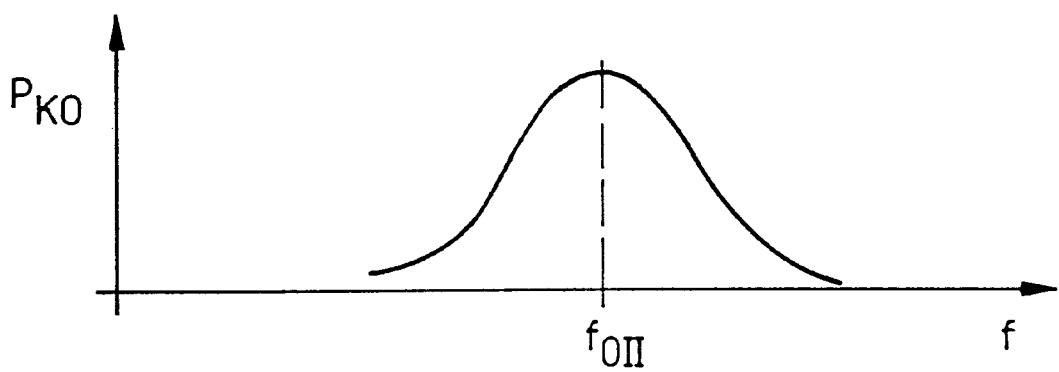
Figure 6C:
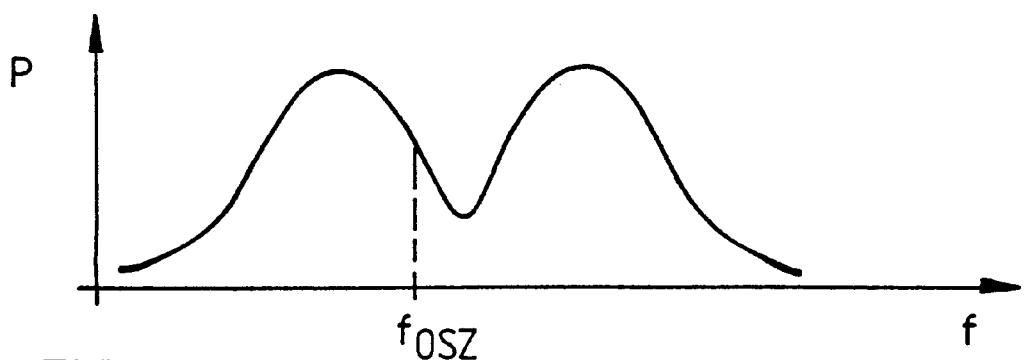

The FIGS. 6a to 6c show reactive power resonance curves for the waveguide oscillator. The radiated reactive power of the transmitting slotted guides P (ind SE) is plotted in FIG. 6a. FIG. 6b shows the reactive power of the compensation slotted guides P (ind KO), and FIG. 6c shows the superimposed reactive powers in the total circuit P. The frequency f (ind OSZ) corresponds to the frequency for operating the semiconductor oscillating elements 3, 18 in the circuits according to the invention.

For all the exemplary embodiments described in the above, the effect of the compensation slotted guides 6, 7 can be increased in that the slotted guide structure 2 is inserted at a quarter-wave distance to a short-circuited end of the waveguide 1. The HF shares reflected at this quarter wave short circuit contribute to the compensation of the reactive powers radiated by the transmitting slotted guides.

I claim:

1. A waveguide oscillator for generating carrier waves in a waveguide is designed as a planar slotted guide structure which is arranged approximately perpendicular to the longitudinal axis of the waveguide in a cross-sectional surface of the waveguide, the slotted guide structure comprising:

transmitting slotted guides having open ends, the open ends of the transmitting slotted guides being connected in series;

a semiconductor oscillating element integrated into the slotted guide structure and bridging the interconnected open ends of the transmitting slotted guides;

at least one compensation slotted guide, the transmitting slotted guides having the same first resonance frequency and the at least one compensation slotted guide having a second resonance frequency which deviates from the first resonance frequency;

an internal conductor surface; and an external conductor surface, said internal and external conductor surfaces being separated galvanically in the slotted guide structure; wherein direct current is supplied to the semiconductor oscillating element via the internal conductor surface and the external conductor surface.

2. A waveguide oscillator according to claim 1 wherein the semiconductor oscillating element is arranged in the slotted guide structure adjacent to the base point of a maximum field strength vector for a neighboring waveguide-E-field.

3. A waveguide oscillator according to claim 1 wherein the electrically effective length of the transmitting slotted guides respectively amounts to one half of the wavelength of the carrier wave to be generated.

4. A waveguide oscillator according to claim 1, wherein the waveguide has an inside space with a border and the transmitting slotted guides are located approximately adjacent to the inside border of the waveguide along their entire lengths.

5. A waveguide oscillator according to claim 1 wherein the slotted guide structure has two identically designed compensation slotted guides with interconnected open ends.

6. A waveguide oscillator according to claim 5, wherein the waveguide has an inside space with a border and the compensation slotted guides have outside edges which approximately adjoin the border for the waveguide inside space, the open ends of the compensation slotted guides being arranged opposite the semiconducting oscillating element, and further comprising stubs which are integrated into the slotted guide structure outside of the border of the waveguide inside space wherein the second resonance frequency for each of the compensation slotted guides is synchronized electrically by a respective one of the stubs.

7. A waveguide oscillator according to claim 5, further comprising capacitive elements formed in the slotted structure.

8. A waveguide oscillator according to claim 5, wherein the interconnected compensation slotted guides are short-circuited slotted guides having approximately a quarter-wave length, the short-circuited slotted guides being arranged centrally and perpendicular to vectors of an adjoining waveguide-E-field.

9. A waveguide oscillator according to claim 8, wherein the interconnected compensation slotted guides form a H-aperture.

10. A waveguide oscillator according to claim 8, wherein the waveguide has an inside space with a border and the slotted guide structure has two additional transmitting slotted guides which adjoin the border of the waveguide inside space approximately along their entire length, the resonance frequency of the additional transmitting slotted guides coincides with the first resonance frequency of the first two transmitting slotted guides.

11. A waveguide oscillator according to claim 10, wherein the two additional transmitting slotted guides have open ends, the two additional transmitting slotted guides being interconnected at their open ends at a junction, and wherein the slotted guide structure further comprises a second semiconductor oscillating element which bridges the open ends of the additional transmitting slotted guides opposite the first semiconductor oscillating element.

12. A waveguide oscillator according to claim 11, further comprising capacitive elements that are formed in the slotted guide structure outside of the border for the waveguide inside space wherein the transmitting slotted guide and additional transmitting slotted guide which are arranged on the same side of the first and second semiconductor elements are respectively short-circuited against each other at the junction by means of one of the capacitive elements.

13. A waveguide oscillator according to claim 10, wherein the additional transmitting slotted guides each have one HF short circuit on one end, the ends of the additional transmitting slotted guides which are provided with HF short circuits are arranged opposite the semiconductor oscillating element.

14. A waveguide oscillator according to claim 13, further comprising capacitive elements that are formed in the slotted guide structure outside of the border for the waveguide inside space wherein the transmitting slotted guide and additional transmitting slotted guide arranged on the same side of the semiconductor oscillating element are respectively short-circuited against each other at the junction by means of one of the capacitive elements.

15. A waveguide oscillator according to claim 10, wherein the transmitting slotted guides respectively have an electrically effective length that corresponds to one half the wavelength of the carrier wave to be generated in the waveguide.

16. A waveguide oscillator according to claim 10, wherein the waveguide has a quarter-wave short-circuit on one side of the slotted guide structure that is inserted into the waveguide and the other side of the waveguide, and the slotted guide structure feeds the carrier wave into a continuing segment of the waveguide.

17. A waveguide oscillator according to claim 1, wherein the cross-section of the waveguide has a rectangular shape.

18. A waveguide oscillator according to claim 1, wherein the cross-section of the waveguide has a circular shape.

* * * * *